(12) United States Patent
Williamson et al.

(10) Patent No.: US 11,804,382 B2
(45) Date of Patent: Oct. 31, 2023

(54) METHOD OF FORMING PACKAGE SUBSTRATE WITH PARTIALLY RECESSED CAPACITOR

(71) Applicant: TEXAS INSTRUMENTS INCORPORATED, Dallas, TX (US)

(72) Inventors: Jaimal Mallory Williamson, McKinney, TX (US); Snehamay Sinha, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/707,872

(22) Filed: Mar. 29, 2022

(65) Prior Publication Data

US 2022/0223509 A1    Jul. 14, 2022

Related U.S. Application Data

(62) Division of application No. 16/795,873, filed on Feb. 20, 2020, now Pat. No. 11,289,412.

(Continued)

(51) Int. Cl.
*H01L 21/48*     (2006.01)
*H01L 23/498*    (2006.01)
(Continued)

(52) U.S. Cl.
CPC ...... *H01L 21/4857* (2013.01); *H01L 21/4853* (2013.01); *H01L 23/49816* (2013.01);
(Continued)

(58) Field of Classification Search
CPC .......... H01L 23/49822; H01L 21/4853; H01L 21/4857; H01L 23/49816; H01L 23/642; H01L 24/16; H01L 24/81
See application file for complete search history.

(56) References Cited

U.S. PATENT DOCUMENTS 5,260,518 A    11/1993  Tanaka et al.
5,875,100 A    2/1999   Yamashita
(Continued)

OTHER PUBLICATIONS

AEC Component Technical Committee, Stress Test Qualification for Passive Components, AEC-Q200 REV D, Jun. 1, 2010, Automotive Electronics Council, United States of America.
(Continued)

*Primary Examiner* — Michael Jung
(74) *Attorney, Agent, or Firm* — Dawn Jos; Frank D. Cimino (57) ABSTRACT

A semiconductor package includes a multilayer substrate including a dielectric layer, a first conductive layer forming a first set of electrical contacts, a second conductive layer forming package electrical contacts and two capacitor electrical contacts, conductive vias extending through the dielectric layer between the first conductive layer with the second conductive layer, and a solder mask layer over the second conductive layer. The semiconductor package further includes a semiconductor die on the first side of the multilayer substrate electrically connected a capacitor on the second side of the multilayer substrate. A recessed portion of the capacitor is within a capacitor opening of the solder mask layer between the two capacitor electrical contacts and a board-side surface of the solder mask layer.

14 Claims, 9 Drawing Sheets

Related U.S. Application Data (60) Provisional application No. 62/955,504, filed on Dec. 31, 2019, provisional application No. 62/817,936, filed on Mar. 13, 2019.

(51) Int. Cl.
*H01L 23/64* (2006.01)
*H01L 23/00* (2006.01)

(52) U.S. Cl.
CPC ...... *H01L 23/49822* (2013.01); *H01L 23/642* (2013.01); *H01L 24/16* (2013.01); *H01L 24/81* (2013.01); *H01L 2224/16235* (2013.01); *H01L 2224/81815* (2013.01)

(56) References Cited

U.S. PATENT DOCUMENTS

| | | | |
|---|---|---|---|
| 6,272,020 B1 | 8/2001 | Tosaki et al. | |
| 6,507,119 B2 | 1/2003 | Huang et al. | |
| 6,710,998 B1 | 3/2004 | Saito et al. | |
| 6,953,893 B1 | 10/2005 | Kuzmenka | |
| 7,061,102 B2 | 6/2006 | Eghan et al. | |
| 7,084,500 B2 | 8/2006 | Swnson et al. | |
| 7,112,520 B2 | 9/2006 | Lee et al. | |
| 7,279,771 B2 | 10/2007 | Sunohara et al. | |
| 7,531,906 B2 | 5/2009 | Lee | |
| 7,745,926 B2 | 6/2010 | Miyazaki et al. | |
| 8,130,507 B2 | 3/2012 | Origuchi et al. | |
| 8,264,846 B2 | 9/2012 | Jones et al. | |
| 8,276,269 B2 | 10/2012 | Jomaa et al. | |
| 8,659,872 B2 | 2/2014 | Togashi | |
| 9,293,426 B2 | 3/2016 | Hossain et al. | |
| 9,607,766 B2 | 3/2017 | Saito | |
| 2002/0086561 A1 | 7/2002 | Ogawa et al. | |
| 2004/0022038 A1 | 2/2004 | Figueroa et al. | |
| 2005/0218502 A1 | 10/2005 | Sunohara et al. | |
| 2010/0073894 A1* | 3/2010 | Mortensen | C25D 1/00 361/782 |
| 2014/0183744 A1 | 7/2014 | Lee | |
| 2017/0287853 A1 | 10/2017 | Kim et al. | |
| 2018/0355423 A1 | 12/2018 | Yang et al. | |
| 2018/0366423 A1* | 12/2018 | Ong | H01L 23/49827 |
| 2019/0159333 A1 | 5/2019 | Sinha et al. | |
| 2019/0311978 A1 | 10/2019 | Cheah et al. | |
| 2020/0058569 A1 | 2/2020 | Cho et al. | |
| 2020/0128673 A1* | 4/2020 | Cheah | H01L 23/50 |

OTHER PUBLICATIONS

Min et al., Embedded Capacitors in the Next Generation Processor, 2013 IEEE 63rd Electronic Components and Technology Conference, Aug. 8, 2013, pp. 1225-1229, IEEE, Las Vegas, Nevada, United States of America.

\* cited by examiner

FIG. 5

METHOD OF FORMING PACKAGE SUBSTRATE WITH PARTIALLY RECESSED CAPACITOR

RELATED APPLICATIONS

This application is division to U.S. patent application Ser. No. 16/795,873, filed Feb. 20, 2020, which claims the benefit of and priority to U.S. Provisional Application No. 62/955,504, filed Dec. 31, 2019 and further to U.S. Provisional Application No. 62/817,936, filed Mar. 13, 2019, both of which are hereby fully incorporated herein by reference.

TECHNICAL FIELD

This disclosure relates to semiconductor packages.

BACKGROUND

Among the long-term trends in semiconductor technology which continue unabated are the trends towards miniaturization, integration, and speed. Such trends include thinning existing package designs without changing a form factor of the package and adding components to existing package designs, such as one or more additional semiconductor dies and/or additional passive or active components, such as sensors, capacitors, transformers, etc.

In a particular aspect, capacitors used to filter data/and or power signals may be integrated within a package. Generally speaking, it is preferable to locate package capacitors close to a semiconductor die to reduce electrical impedance of the conductive loop including the semiconductor die and the capacitor.

BRIEF SUMMARY

A capacitor is mounted to a substrate of the package opposite the semiconductor die, such as under the profile of the semiconductor die, in a land side capacitor (LSC) configuration. Compared to a die side capacitor (DSC) configuration, an LSC configuration supports a lower inductance as substrate conductors between the capacitor and the semiconductor die extend through a thickness of the substrate rather than to a location outside the profile of the semiconductor die.

Capacitors mounted in an LSC configuration allow for lower inductance compared capacitors mounted in a DSC configuration; however, such capacitors must fit within the gap between the substrate of a semiconductor package and a board. For packages with ball grid array connections, this gap is set by the standoff height of collapsed solder balls of the ball grid array. Capacitors with low profiles are more suitable for mounting in an LSC configuration. Generally speaking, the standoff height of collapsed solder balls of the ball grid array is reduced as the pitch (spacing) of the array is reduced.

As further disclosed herein, a solder mask layer of a package substrate includes a capacitor opening over two capacitor electrical contacts of a conductive layer of the substrate. A capacitor is mounted within the capacitor opening with a thickness of the capacitor is at least partially recessed within the capacitor opening. Such designs allow for a capacitor having a thicker profile than alterative designs in which a capacitor is mounted over the solder mask layer of the package substrate.

In one example, a semiconductor package includes a multilayer substrate including a dielectric layer, a first conductive layer forming a first set of electrical contacts on a first side of the dielectric layer, a second conductive layer forming a second set of electrical contacts on a second side of the dielectric layer, the second set of electrical contacts including package electrical contacts and two capacitor electrical contacts, conductive vias extending through the dielectric layer between the first conductive layer with the second conductive layer, and a solder mask layer over the second conductive layer, the solder mask layer forming electrical contact openings adjacent the package electrical contacts and forming a capacitor opening over the two capacitor electrical contacts. The semiconductor package further includes a semiconductor die on the first side of the multilayer substrate and electrically connected to the first set of electrical contacts, and a capacitor on the second side of the multilayer substrate and electrically connected to the semiconductor die via the two capacitor electrical contacts and the multilayer substrate with a recessed portion of the capacitor being within the capacitor opening between the two capacitor electrical contacts and a board-side surface of the solder mask layer.

In another example, a semiconductor package substrate includes a dielectric layer, a first conductive layer forming a first set of electrical contacts on a first side of the dielectric layer, a second conductive layer forming a second set of electrical contacts, the second set of electrical contacts including package electrical contacts and two capacitor electrical contacts, on a second side of the dielectric layer, conductive vias that electrically connect the first conductive layer with the second conductive layer through the dielectric layer, and a solder mask layer over the second conductive layer, the solder mask layer forming electrical contact openings adjacent each of the package electrical contacts and forming a capacitor opening over the two capacitor electrical contacts. The capacitor opening has a rounded shape with a radius at least 50 percent of a thickness of the solder mask layer.

In another example, a method of forming a package includes mounting a semiconductor die on a multilayer substrate to electrically connect the semiconductor die to a first set of electrical contacts of the multilayer substrate. The multilayer substrate includes a dielectric layer, a first conductive layer forming the first set of electrical contacts on a first side of the dielectric layer, a second conductive layer forming a second set of electrical contacts on a second side of the dielectric layer, the second set of electrical contacts including package electrical contacts and two capacitor electrical contacts, conductive vias extending through the dielectric layer between the first conductive layer with the second conductive layer, and a solder mask layer over the second conductive layer, the solder mask layer forming electrical contact openings adjacent the package electrical contacts and forming a capacitor opening over the two capacitor electrical contacts. The method further includes mounting a capacitor on the two capacitor electrical contacts to electrically connect the capacitor to the two capacitor electrical contacts with a recessed portion of the capacitor being within the capacitor opening between the two capacitor electrical contacts and a board-side surface of the solder mask layer.

DETAILED DESCRIPTION

Low profile capacitors with thicknesses suitable for use as capacitors may not provide desired functionality and/and reliability ratings, especially with small-pitched ball grid arrays. To facilitate use of capacitors with thicker profiles as capacitors, semiconductor packages disclosed herein include a solder mask layer with a capacitor opening over capacitor electrical contacts of a conductive layer of a package substrate. A capacitor is mounted within the capacitor opening with a thickness of the capacitor is at least partially recessed within capacitor opening. Such a configuration reduces a standoff height of the capacitor relative to the board-side surface of solder mask layer, thereby allowing for a capacitor having a thicker profile than alterative designs in which a capacitor is mounted over the solder mask layer of a package substrate. Thicker capacitors may provide additional capacity or reliability. In addition, such designs may further facilitate using a reduced pitch for a package ball grid array as the standoff height of collapsed solder balls of the ball grid array is reduced as the pitch (spacing) of the array is reduced. An example package utilizing such techniques, semiconductor package 100, is shown and described with respect to FIGS. 1A-1C.

Figure 1A:
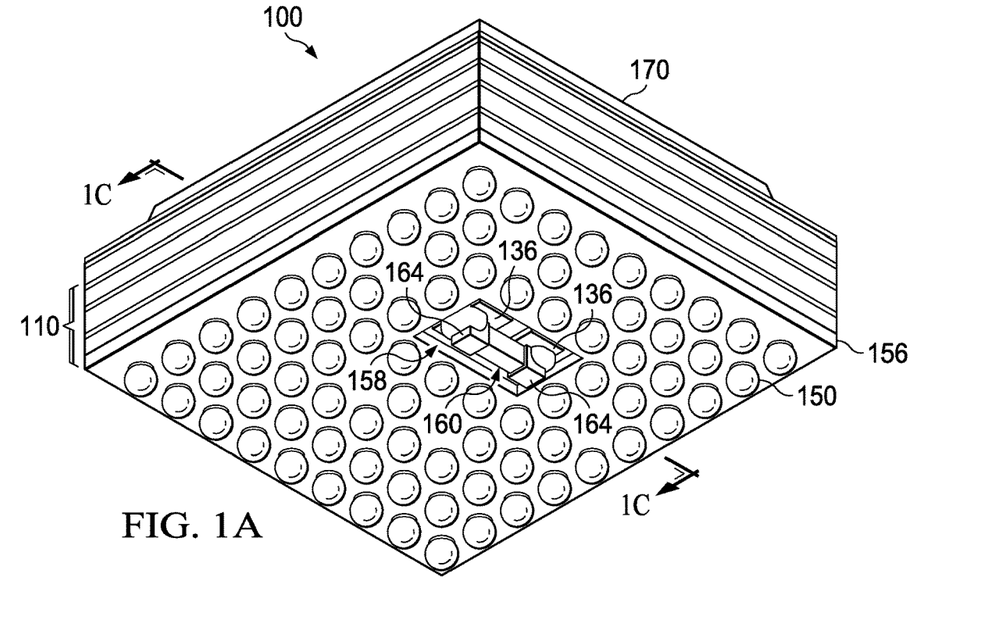
FIGS. 1A-1C illustrate a semiconductor package with a capacitor mounted within a capacitor opening of a solder mask layer of the package.
Figure 1B:
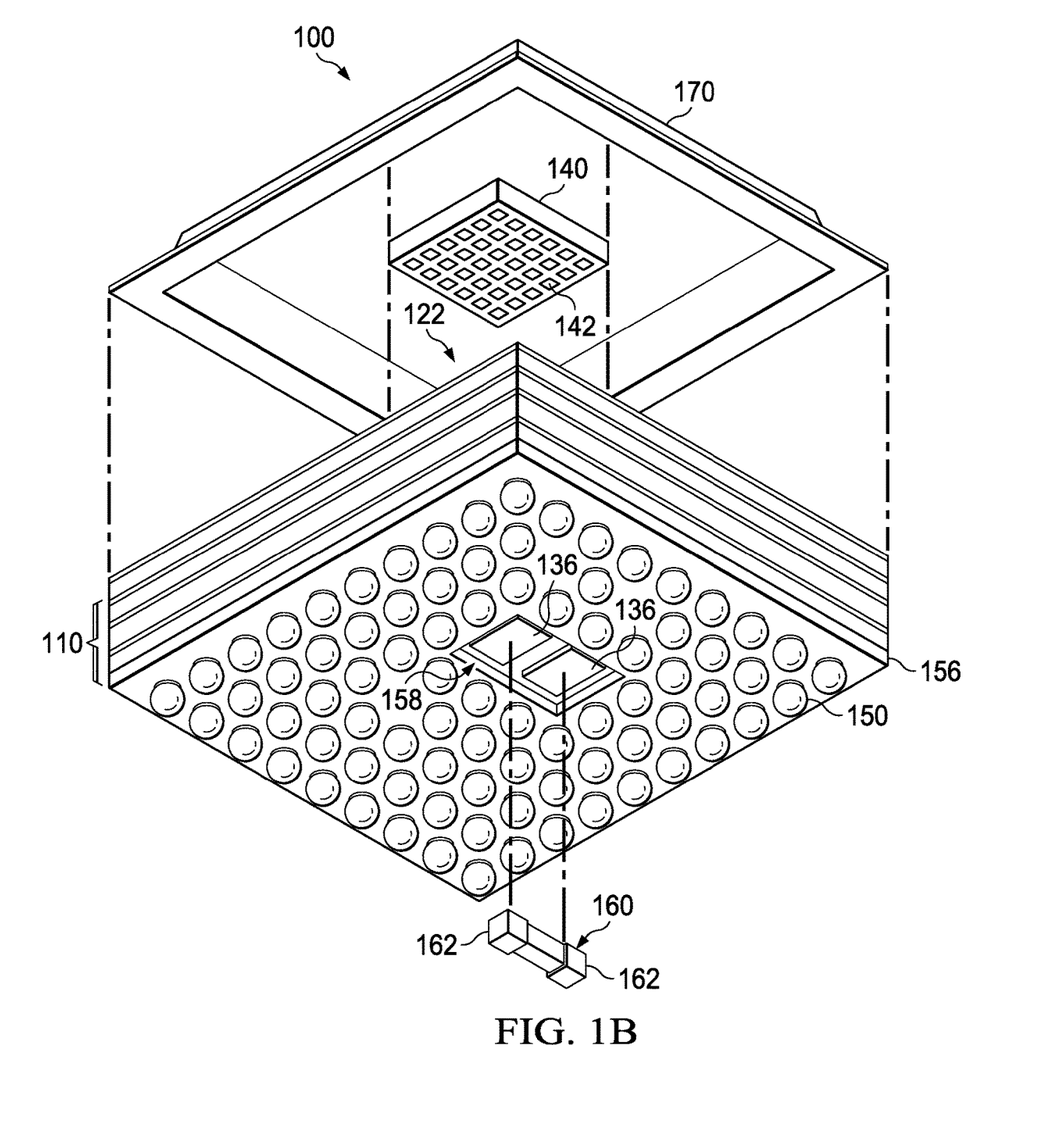
Figure 1C:
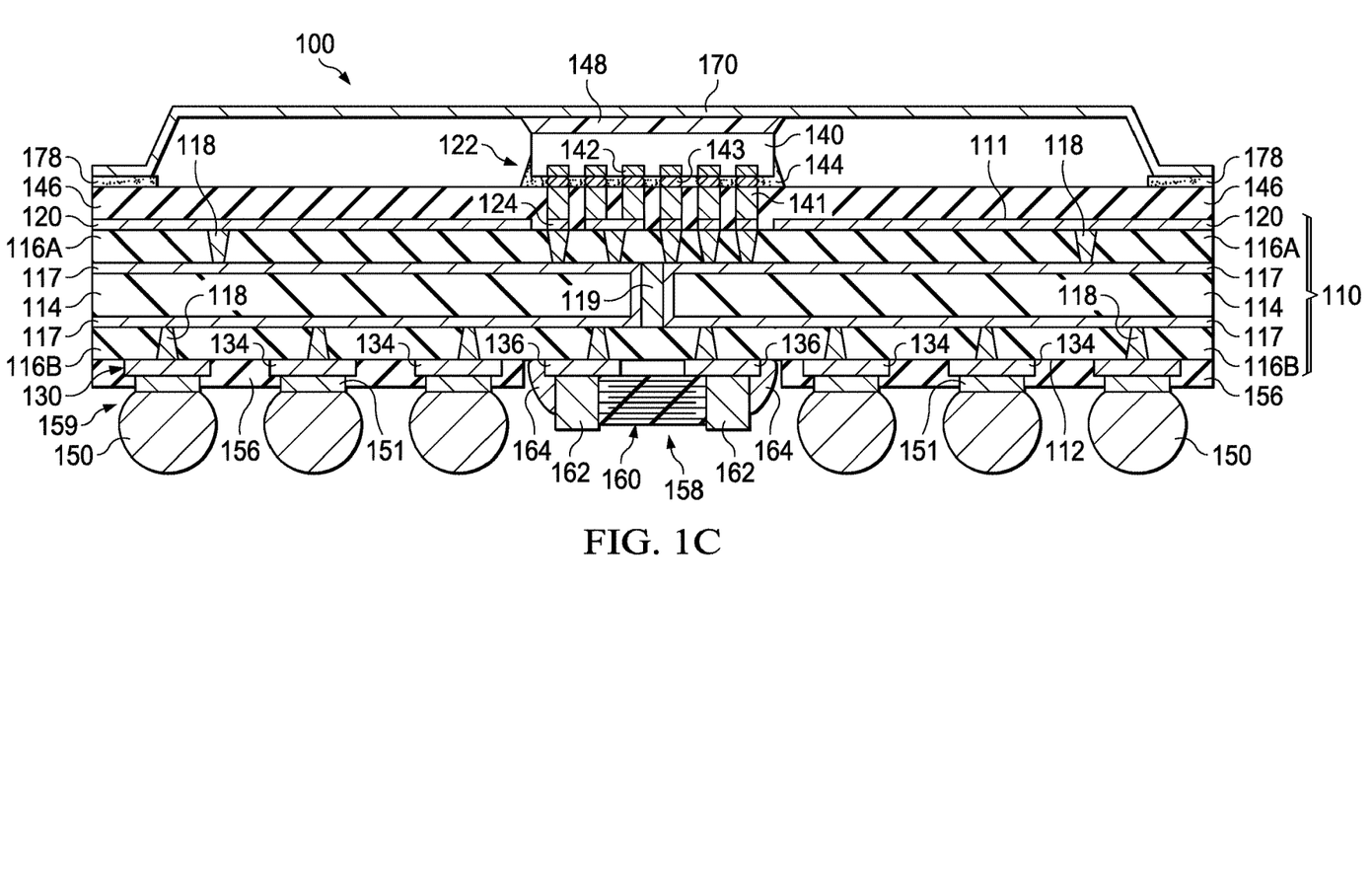

FIG. 1A is a perspective view of semiconductor package 100 illustrating capacitor 160 mounted within capacitor opening 158 of solder mask layer 156, whereas FIG. 1B is a perspective exploded view of semiconductor package 100, and FIG. 1C is sectional side view of semiconductor package 100. Semiconductor package 100 includes a multilayer substrate 110, a semiconductor die 140 including die terminals 142, and a capacitor 160 including capacitor terminals 162. As shown in FIG. 1C, multilayer substrate 110 includes a dielectric core 114 with internal conductive layers 117 patterned thereon. Conductive core via 119 is representative of one or more conductive vias forming electrical connections between internal conductive layers 117 through dielectric core 114. Build-up dielectric layers 116A, 116B (collectively, "dielectric layers 116") cover internal conductive layers 117.

On a first side 111 of multilayer substrate 110, external conductive layer 120 forms a first set of electrical contacts including a set of die contacts 124 representing a die attach site 122. Die contacts 124 correspond to die terminals 142. Semiconductor die 140 is mounted to die attach site 122 with die terminals 142 electrically connected to die contacts 124. For example, semiconductor die 140 may be mounted to die attach site 122 with a flip chip connection using solder bumps or solder-tipped metal (such as copper pillars). Multilayer substrate 110 further includes an external conductive layer 130 a second side 112 of dielectric layers 116.

Conductive layer 130 forms a second set of electrical contacts including package electrical contacts 134 and two capacitor electrical contacts 136 for connection to capacitor 160. Package electrical contacts 134 correspond to solder ball array 150. Package electrical contacts 134 of external conductive layer 130 surround capacitor electrical contacts 136. Capacitor 160 is mounted within capacitor opening 158 of solder mask layer 156 with capacitor terminals 162 electrically connected to two capacitor electrical contacts 136 with a thickness of capacitor 160 is partially recessed within capacitor opening 158. Specifically, a recessed portion of capacitor 160 is capacitor opening 158 opening between capacitor electrical contacts 136 and a board-side surface of solder mask layer 156. Such a configuration reduces a standoff height of capacitor 160 relative to the board-side surface of solder mask layer 156 and allows the selection of thicker capacitors for use as capacitor 160. Thicker capacitors may provide additional capacity or reliability.

Internal conductive layers 117 are formed on and within dielectric core 114. Dielectric layers 116 represent build-up layers over dielectric core 114 and internal conductive layers 117. The electrical conductors of multilayer substrate 110 include external conductive layer 120 on dielectric layer 116A at side 111 of substrate 110, as well as external conductive layer 130 on dielectric layer 116B at side 112 of substrate 110. Internal conductive layers 117 include metal traces in two dimensional patterns interconnected with one or more conductive vias such as conductive core via 119. In turn, internal conductive blind vias 118 provide electrical connections between internal conductive layers 117 and external conductive layers 120, 130. Likewise, external conductive layers 120, 130 include patterned metal traces that combine with blind vias 118 and internal conductive layers 117 to provide electrical connections between components of package 100 and solder ball array 150.

Dielectric core 114 and dielectric layers 116, may represent a laminate substrate, and internal conductive layers 117 may extend between the laminate layers of dielectric core 114 and dielectric layers 116. The quantity and layout of internal conductive layers 117, internal conductive blind vias 118 of multilayer substrate 110, and conductive core via 119, as illustrated in FIG. 1C is merely conceptual, and any number of configurations for the conductors of multilayer substrate 110 are possible. In the example of FIG. 1C, dielectric core 114 and dielectric layers 116 represent a three-layer dielectric substrate with two internal conductive layers 117. Other examples may include a different number of layers, such as a seven-layer dielectric substrate with six internal conductive layers.

A variety of materials may be selected for dielectric core 114 and dielectric layers 116, and each layer may include the same or different material compositions. As non-limiting examples, dielectric core 114 and dielectric layers 116 may be formed from ceramics or organic materials, including inert polymeric materials such as polyimide. Other organic materials, such as resins, including epoxy resin, polyurethane resin, or silicone resin may also be selected for dielectric core 114 and dielectric layers 116. In some examples, various layers of dielectric core 114 and dielectric layers 116 may be filled or unfilled and include one or more of the following: resin, hardener, curing agent, fused silica, inorganic fillers, catalyst, flame retardants, stress modifiers, adhesion promoters, and other suitable components. Fillers, if any, may be selected to modify properties and characteristics of the resin base materials. Inert inorganic fillers may be selected to lower CTE, increase thermal conductivity, and/or increase elastic modulus. Particulate fillers may be selected to reduce strength characteristics such as tensile strength and flexural strength compared to the resin base materials.

The thickness of the multilayer substrate 110 may be within a range of 0.1 mm to 1 mm, such as about 0.20 mm, 0.40 mm, or 0.80 mm, such as within a range of 0.15 mm to 0.50 mm. At thicknesses below 0.1 mm, or even below 0.15 mm, dielectric core 114 and dielectric layers 116 between conductive layers 120, 130 of multilayer substrate 110 may not be effective depending on electrical currents and substrate materials selected.

Package 100 may further include a solder mask layer 146 over conductive layer 120 on side 111 of multilayer substrate 110. Solder mask layer 146 is an electrically insulating layer covering electrical traces of external conductive layer 120 and includes openings for electrical contacts of die attach site 122.

The active side of semiconductor die 140 is mounted to multilayer substrate 110 at die attach site 122 of external conductive layer 120 and secured with solder bumps 143 at die terminals 142. Underfill 144 fills the interface of semiconductor die 140 and multilayer substrate 110. As used herein, an active side of a semiconductor die is a side including conductive die terminals which serve as terminals to connect the components of the semiconductor die to external elements, such as a substrate or leadframe. For example, semiconductor die 140 includes metallized die terminals 142 on its active side. Die terminals 142 may be aluminum pads or copper pads for example. The die terminals may include plated bumps, such as copper plated bumps on copper pads.

The active side of semiconductor die 140 is protected by an electrically insulating layer (not shown) of an inert polymeric material such as polyimide, which may have been applied to a surface of a semiconductor wafer used to form semiconductor die 140 before wafer singulation. The electrically insulating layer of semiconductor die 140 has a plurality of openings to expose die terminals 142. FIG. 1C is merely a conceptual illustration and various examples may include any number of die terminals 142 on semiconductor die 140 with a corresponding pattern of electrical contacts forming die attach site 122 of conductive layer 120.

Multilayer substrate 110 connects semiconductor die 140 to package electrical contacts 134 and solder ball array 150. Package 100 provides a fan-out configuration in that package electrical contacts 134 on side 112 of multilayer substrate 110 forms an array covering an area larger than die terminals 142 on active side of semiconductor die 140.

Semiconductor package 100 further includes a heat spreader 170 thermally coupled to semiconductor die 140 opposite die terminals 142. Heat spreader 170 may represent a shaped metal covering over semiconductor die 140 and side 111 of multilayer substrate 110, such as a stamped metal. In alternatives examples including molded semiconductor packages, heat spreader 170 may be omitted or may be secured with the package mold compound covering a semiconductor die. The passive side of semiconductor die 140 includes a thermal interface material 148 adjacent to heat spreader 170 to improve heat dissipation. In various examples, thermal interface material 148 may represent a thermal paste or thermal tape.

Heat spreader 170 is secured to solder mask layer 146 outside a perimeter of semiconductor die 140 with adhesive 178, which may also represent a thermal interface material. In some examples heat spreader 170 may be electrically connected to external conductive layer 120, such as a grounded portion of external conductive layer 120. In such examples, adhesive 178 may represent a solder or an electrically conductive thermal interface material. Heat spreader 170 further covers all or a portion of side 111 of multilayer substrate 110. In this manner, heat spreader 170 may further represent a protective covering for semiconductor die 140 and other components (not shown) on side 111 of multilayer substrate 110.

In addition to or as an alternative to heat spreader 170 and thermal interface material 148, solder ball array 150 may utilize thermal solder bumps to facilitate heat transfer from semiconductor die 140 and other components of semiconductor package 100 to an external board.

As shown in FIGS. 1A-1C, semiconductor package 100 is a moldless semiconductor package. In other examples, a semiconductor package utilizing a capacitor at least partially recessed within a capacitor opening of a solder mask layer may include a mold compound protecting semiconductor die 140 and other components of the package. Such molded packages may or may not include a heat spreader thermally coupling a semiconductor die to an external surface of the package.

A solder mask layer 156 covers conductive layer 130, solder mask layer 156 forming electrical contact openings 159 adjacent each of package electrical contacts 134 and forming a capacitor opening 158 over two capacitor electrical contacts 136. In some examples, package electrical contacts 134 may be solder mask layer defined, and capacitor electrical contacts 136 are non solder mask layer defined. As referred to herein, solder mask layer defined means that a solder mask layer forms a perimeter over an electrical contact with only a flat portion of a conductive layer, such as conductive layer 130, is exposed to form the electrical contact, such as with electrical contact openings 159. In contrast, with non solder mask layer defined electrical contacts, at least one edge of the patterned conductive layer is exposed within the solder mask layer opening. With non solder mask layer defined openings, a solder fillet may be formed on exposed edges of the conductive layer, as with direct solder connections 164, which electrically connects capacitor electrical contacts 136 with capacitor terminals 162 of capacitor 160 within capacitor opening 158 of solder mask layer 156.

Semiconductor package 100 further includes pre-solder 151 within electrical contact openings 159, but not capacitor opening 158. In some examples, capacitor electrical contacts 136 include a solderable layer, such as an organic solderable preservative, over a base metal forming conductive layer 130. Such a solderable layer may prevent mitigate oxidation or other corrosion of capacitor electrical contacts 136 prior to reflowing to attach capacitor terminals 162 of capacitor 160 to capacitor electrical contacts 136 within capacitor opening 158. Such examples may include screen-printing a solder paste to electrical contacts 136 within capacitor opening 158, before or after placing capacitor 160 within capacitor opening 158, and heating the assembly of multilayer substrate 110 and capacitor 160 to reflow the solder to form direct solder connections 164.

In various examples, the base metal of internal conductive layers 117, blind vias 118, and external conductive layers 130 may include copper, copper alloys, aluminum, aluminum alloys, iron-nickel alloys, or nickel-cobalt ferrous alloys. As an assembly, most of the base metals of multilayer substrate 110 are covered. For example, internal conductive layers 117 are covered by build-up dielectric layers 116, and blind vias 118 are covered by external conductive layers 120, 130. In addition, external conductive layer 120 is mostly covered by solder mask layer 146, while die contacts 124 are covered by pre-solder 141. Similarly, external conductive layer 120 is mostly covered by solder mask layer 156, while package electrical contacts 134 are covered by pre-solder 151.

Capacitor electrical contacts 136 may be treated a solderable layer to resist oxidation. Such a solderable layer may be a coating of thin layers of other metals on the base metal surface. In some examples, the planar base metal may be plated with a plated layer resistant to oxidation. In an example, the plated layer may include a layer of nickel plated on the base metal and a layer of palladium plated on the nickel layer. Some of such examples, a layer of gold may be plated on the palladium layer. As an example when copper forms the base metal of external conductive layer 130, plated layers of tin may be used, or a layer of nickel, about 0.5 to 2.0 µm thick in some examples, followed by a layer of palladium, about 0.01 to 0.1 µm thick in the same or different examples, optionally followed by an outermost layer of gold, about 0.003 to 0.009 µm thick in the same or different examples. Such base metal and plating combinations provide resistance to corrosion, such as oxidation, at exposed portions of external conductive layer 130, such as at capacitor electrical contacts 136, while facilitating direct solder connections 164 between capacitor electrical contacts 136 and capacitor terminals 162 of capacitor 160.

While other portions of external conductive layer 130 may be covered in a completed multilayer substrate 110, it may be preferable to treat the entire exposed surface of external conductive layer 130 either before application of solder mask layer 156, or after patterning solder mask layer 156 to form electrical contact openings 159 and capacitor opening 158. In such examples, both package electrical contacts 134 and capacitor electrical contacts 136 may include a layer resistant to oxidation.

As an alternative or in addition to solderable metal layers to resist oxidation, capacitor electrical contacts 136 may be covered by an organic solderable preservative. In some particular examples, pre-solder 141 may be omitted and package electrical contacts 134 may also be covered by an organic solderable preservative. With or without pre-solder 141, external conductive layer 130 may be covered by an organic solderable preservative before solder mask layer 156 is applied over external conductive layer 130. Likewise, external conductive layer 120 may be covered by an organic solderable preservative before solder mask layer 146 is applied.

capacitor 160 is mounted within capacitor opening 158 with capacitor terminals 162 electrically connected to two capacitor electrical contacts 136 with a thickness of capacitor 160 is partially recessed within capacitor opening 158. Specifically, a recessed portion of capacitor 160 is capacitor opening 158 opening between capacitor electrical contacts 136 and a board-side surface of solder mask layer 156. For example, capacitor 160 may be partially recessed within capacitor opening 158 by a depth of at least 0.10 millimeters. Such examples may include screen-printing a solder paste to electrical contacts 136 within capacitor opening 158, before or after placing capacitor 160 within capacitor opening 158, as well as heating the assembly of multilayer substrate 110 and capacitor 160 to reflow the solder to form direct solder connections 164.

Direct solder connections 164 extend between capacitor terminals 162 and two capacitor electrical contacts 136. Capacitor opening 158 helps contain solder to prevent shorting between capacitor electrical contacts 136 and adjacent package electrical contacts 134 from application of direct solder connections 164.

In some examples, capacitor terminals 162 and two capacitor electrical contacts 136 are in direct physical contact with each other or are separated only by a capillary flow of direct solder connections 164. The thickness of such a capillary flow is much less than a thickness or pre-solder 151. For example, while or pre-solder 151 may be at least as thick as solder mask layer 156, a capillary flow of solder between capacitor terminals 162 and two capacitor electrical contacts 136 may be less than half of a thickness of solder mask layer 156, such as less than ten percent of a thickness of solder mask layer 156. Moreover, direct solder connections 164 may have a lower melting temperature than pre-solder 151 so that mounting of capacitor 160 to multilayer substrate 110 does not melt pre-solder 151.

In some examples, capacitor 160 is a multi-layer ceramic chip capacitor 160. In the same or different examples, capacitor 160 may be AEC-Q200, Revision D of Jun. 1, 2010 stress test qualified (referred to herein as, "AEC-Q200 qualified"). AEC-Q200 qualified may be a requirement in some applications where robust and reliable operation of semiconductor package 100 is desired. For example, AEC-Q200 qualified components may be a requirement for aircraft, automotive, and/or military applications. With respect to capacitor 160, AEC-Q200 qualified varieties of multi-layer ceramic chip capacitors generally present greater thicknesses than multi-layer ceramic chip capacitors that are not AEC-Q200 qualified. The thicknesses of AEC-Q200 qualified multi-layer ceramic chip capacitors may reduce or eliminate clearance with a board when mounted in a LSC configuration, such that some or all generally available AEC-Q200 qualified multi-layer ceramic chip capacitors may not fit if located on top of solder mask layer 156. Recessing capacitor 160 within capacitor opening 158 increases the clearance between capacitor 160 and the board, which may allow some AEC-Q200 qualified multi-layer ceramic chip capacitors to be utilized as capacitor 160 in semiconductor package 100.

Solder bumps of solder ball array 150 are positioned on pre-solder 151 over package electrical contacts 134 at electrical contact openings 159 of solder mask layer 156 to facilitate a connection with an external device, through a solder reflow process for example. For example, solder ball array 150 may represent a ball grid array. In various examples, solder ball array 150 may conform to various configurations, such as a flip chip ball grid array (FCBGA), or wire bond fine-pitch ball grid array (FBGA). Note that the number of solder bumps in solder ball array 150 on package 100 has been reduced for simplicity in FIGS. 1C and 2.

Figure 2:
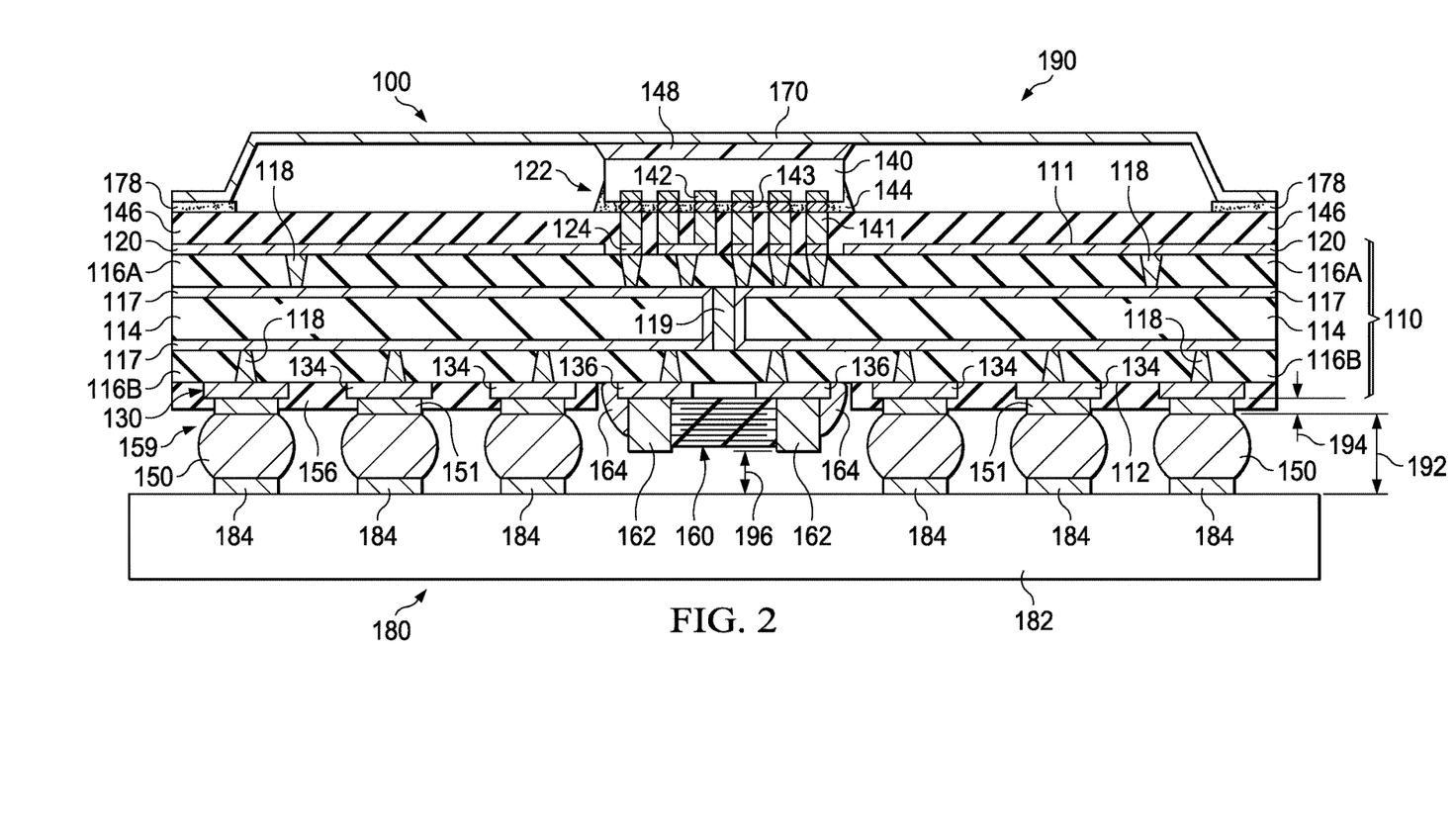
FIG. 2 is an assembly of the semiconductor package of FIGS. 1A-1C mounted to a printed circuit board (PCB).

FIG. 2 is an assembly 190 of semiconductor package 100 mounted to PCB 180. PCB 180 includes a substrate 182, such as an organic substrate, with contact pads 184, formed from a conductive traces on or within substrate 182. PCB 180 may include a number of conductive and dielectric layers as well as any number of electronic components and circuitry.

As shown in FIG. 2, collapsed solder balls of solder ball array 150 provide a stand-off height with gap 192. As discussed with respect to FIGS. 1A-1C, capacitor 160 is partially recessed within capacitor opening 158 by a thickness 194 of solder mask layer 156. As partially recessed within capacitor opening 158, capacitor 160 has a clearance gap 196 with PCB 180.

In some particular examples, capacitor 160 may have a thickness of at least 0.30 millimeters (mm), such as about 0.35 mm. In the same or different examples, collapsed solder balls of solder ball array 150 may provide a collapsed thickness of no greater than 0.40 mm when semiconductor package 100 is mounted to an external board, such as PCB 180. A collapsed thickness of no greater than 0.40 mm corresponds to a solder ball pitch of 0.8 mm. In such examples, capacitor 160 is partially recessed within capacitor opening 158 by a thickness 194 of at least 0.05 mm, such as at least 0.10 mm. Thus, capacitor 160 is partially recessed within capacitor opening 158 to provide clearance gap 196 of at least 0.15 mm with PCB 180.

A clearance gap 196 of at least 0.15 mm with PCB 180 may be important to support manufacturability of assembly 190. For example, such a clearance may limit direct contact between capacitor 160 and PCB 180 when accounting for manufacturing variations during the manufacture of a multitude of assemblies 190. Such a clearance may limit electrical shorts between capacitor 160 and electrical traces of PCB 180 caused either by direct contact or a smaller clearance gap 196. Moreover, direct contact between capacitor 160 and PCB 180 may cause degradation and failure of capacitor 160 over time, limiting the reliability of assembly 190. Of course, these dimensions are merely examples, and other suitable dimensions may apply to a particular application.

Figure 3A:
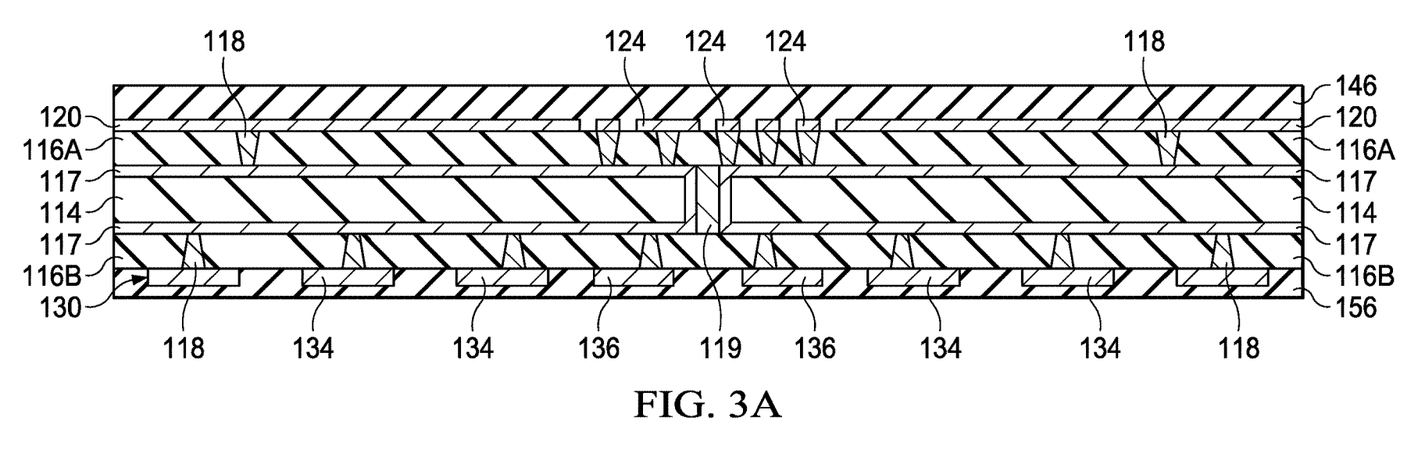
FIG. 3A-3G illustrate manufacturing steps for the semiconductor package of FIGS. 1A-1C.
Figure 3B:
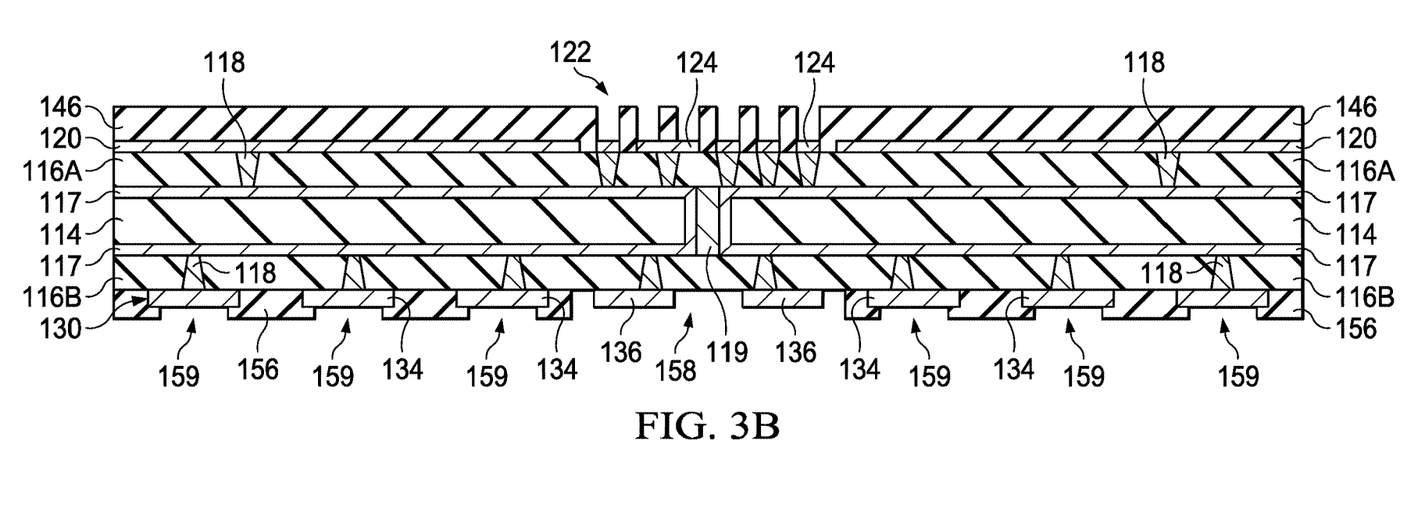
Figure 3C:
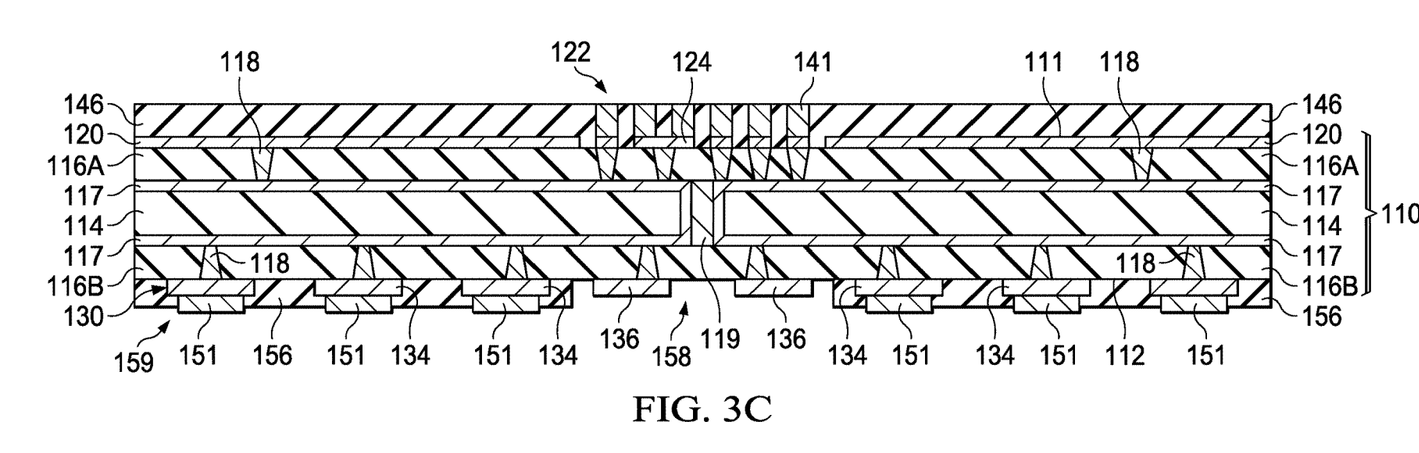

FIGS. 3A-3C illustrate steps in the formation of multilayer substrate 110. FIGS. 3D-3G illustrate steps in the formation of semiconductor package 100 from multilayer substrate 110. FIG. 4 is a flowchart of a method of manufacturing a semiconductor package including a capacitor mounted within a capacitor opening of a solder mask layer of the package, such as package 100 of FIGS. 1A-1C. For clarity, the techniques of FIG. 4 are described with respect to package 100 and FIGS. 3A-3G; however, the described techniques may also be utilized in the manufacture of other semiconductor packages.

A partially completed multilayer substrate 110 including unpatterned solder mask layers 146, 156 is shown in FIG. 3A. In order to form multilayer substrate 110, patterned metal layers are alternated with dielectric layers on dielectric core 114. First, internal conductive layers 117 and conductive core via 119 are formed on dielectric core 114. Conductive core via 119 may be formed within dielectric core 114 by drilling (either mechanical or laser drilling) to create a void, followed by filling the void with metal, for example, by electroplating or sputtering. Forming internal conductive layers 117 may include, for example, electroplating or sputtering, followed by photoetching. In some examples, conductive core via 119 and internal conductive layers 117 may be formed in unison after drilling dielectric core 114 for conductive core via 119.

Dielectric layers 116 are build-up layers over internal conductive layers 117. Internal conductive blind vias 118 may be formed within dielectric layers 116 by drilling (either mechanical or laser drilling) to create voids, followed by filling the voids with metal, for example, by electroplating or sputtering. External conductive layers 120, 130 are patterned on dielectric layers 116 for example, by electroplating or sputtering, followed by photoetching. In some examples, blind vias 118 may be filled in conjunction with the electroplating or sputtering of the adjacent conductive layer. Solder mask layer 146 is applied over external conductive layer 120, and solder mask layer 156 is applied over external conductive layer 130.

As shown in FIG. 3B, solder mask layers 146, 156 of the partially completed multilayer substrate 110 of FIG. 3A are patterned. Patterning solder mask layers 146, 156 may include photoetching. Specifically, solder mask layer 146 is patterned over die contacts 124 to remove solder mask layer to form electrical contact openings for die attach site 122.

Solder mask layer 156 is patterned over package electrical contacts 134 to remove solder mask layer to form electrical contact openings 159 for solder ball array 150 and to further form capacitor opening 158 (FIG. 4, step 202). In some examples, electrical contact openings 159 may be solder mask layer defined, and capacitor electrical contacts 136 are non solder mask layer defined in that capacitor opening 158 may be larger than capacitor electrical contacts 136 and/or include both capacitor electrical contacts 136

As shown in FIG. 3C, pre-solder 141 is applied within electrical contact openings for die attach site 122 of solder mask layer 146. Pre-solder 151 is also applied within electrical contact openings 159 of solder mask layer 156 (FIG. 4, step 204). In this example, no pre-solder is applied within capacitor opening 158; instead, capacitor electrical contacts 136 remain exposed on an outer surface of multilayer substrate 110. Pre-solder 141, 151 may be applied by solder screen printing for example.

It is common for multilayer substrates, such as multilayer substrate 110, to be produced a separate component prior to the assembly of a semiconductor package. For this reason, exposed surfaces of multilayer substrates 110 should resist degradation when exposed to an ambient environment. In some examples, capacitor electrical contacts 136 may be treated a solderable layer to resist oxidation after patterning solder mask layer 156 (FIG. 4, step 206). In other examples, external conductive layer 130 may be treated the solderable layer to resist oxidation prior to the application of solder mask layer 156. In either example, such solderable layers may represent depositions of thin layers of other metals on the base metal surface as described previously with respect to semiconductor package 100.

Figure 3D:
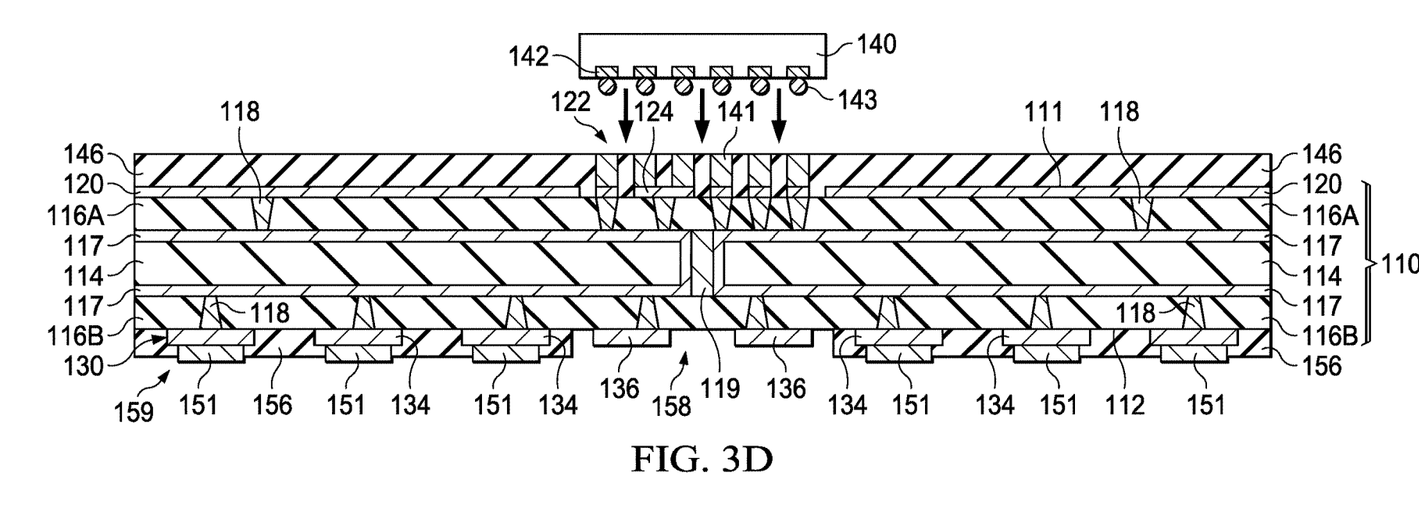
Figure 4:
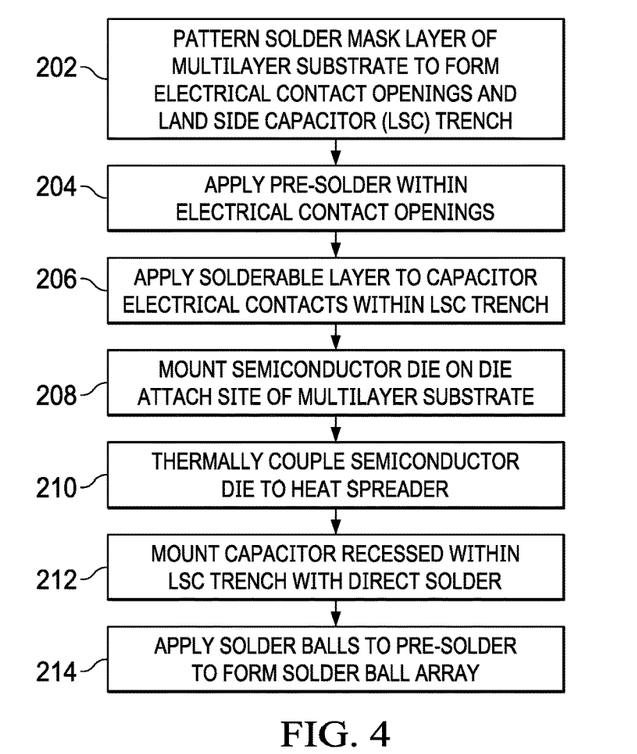
FIG. 4 is a flowchart of a method of manufacturing a semiconductor package with a capacitor mounted within a capacitor opening of a solder mask layer of the package, such as the semiconductor package of FIGS. 1A-1C.

As shown in FIG. 3D, following the formation of multilayer substrate 110, semiconductor die 140 is mounted on die attach site 122 of multilayer substrate 110 to electrically connect die terminals 142 die contacts 124 of multilayer substrate 110 (FIG. 4, step 208). Electrical connections are formed between die terminals 142 and the electrical contacts of die attach site 122. For example, arranging semiconductor die 140 on die attach site 122 of multilayer substrate 110 may include processing a set of solder bumps 143. In some examples, solder bumps 143 may be located on die terminals 142 as part of semiconductor die 140 before it is arranged on die attach site 122. Arranging semiconductor die 140 on die attach site 122 also electrically couples semiconductor die 140 to package electrical contacts 134 via multilayer substrate 110. The reflow of solder bumps 143 also secures the active side of semiconductor die 140 to package electrical contacts 134. Underfill 144 may be applied at to fill the interface of semiconductor die 140 and multilayer substrate 110 through capillary flow.

Figure 3E:
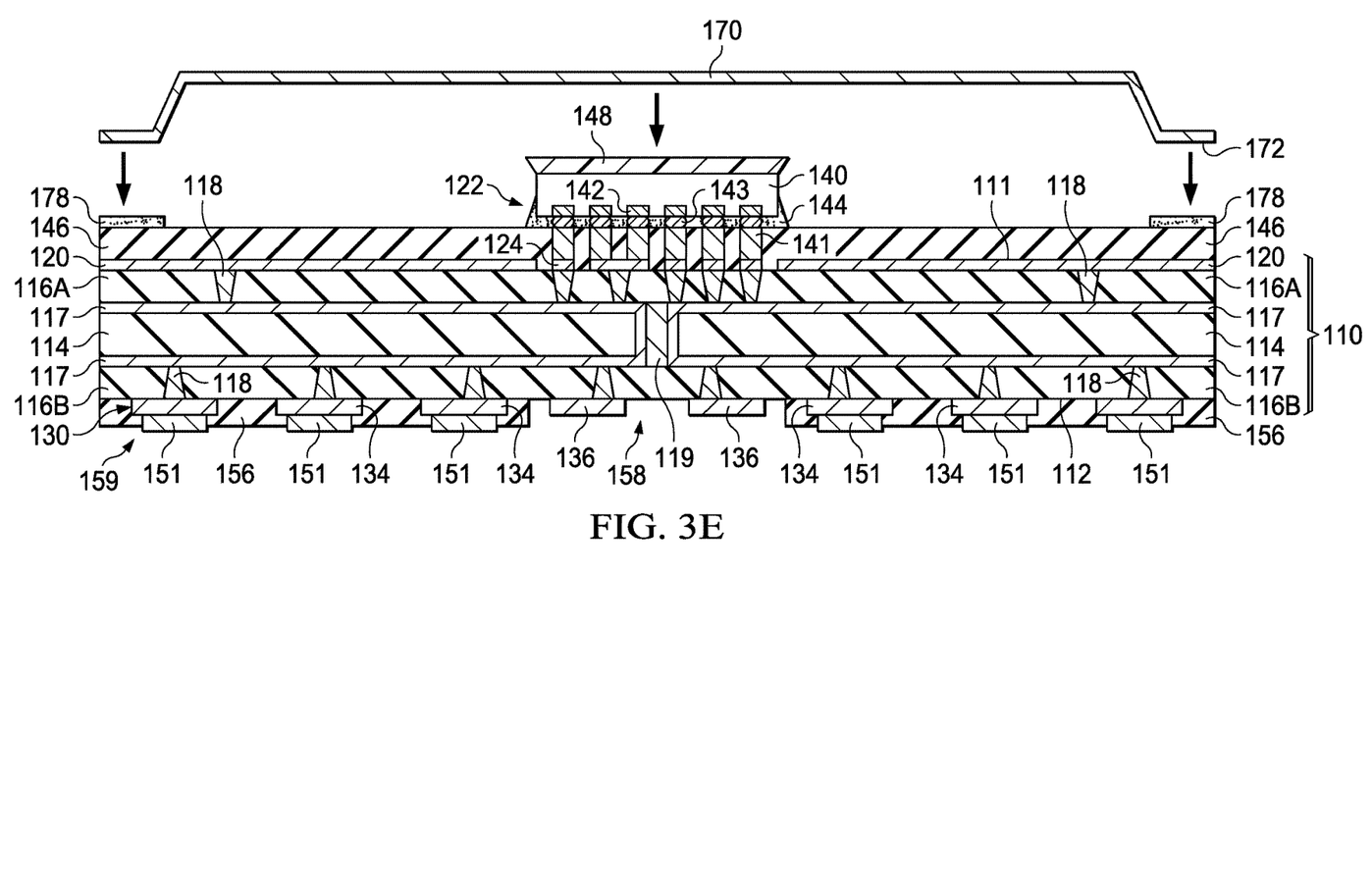
Figure 3F:
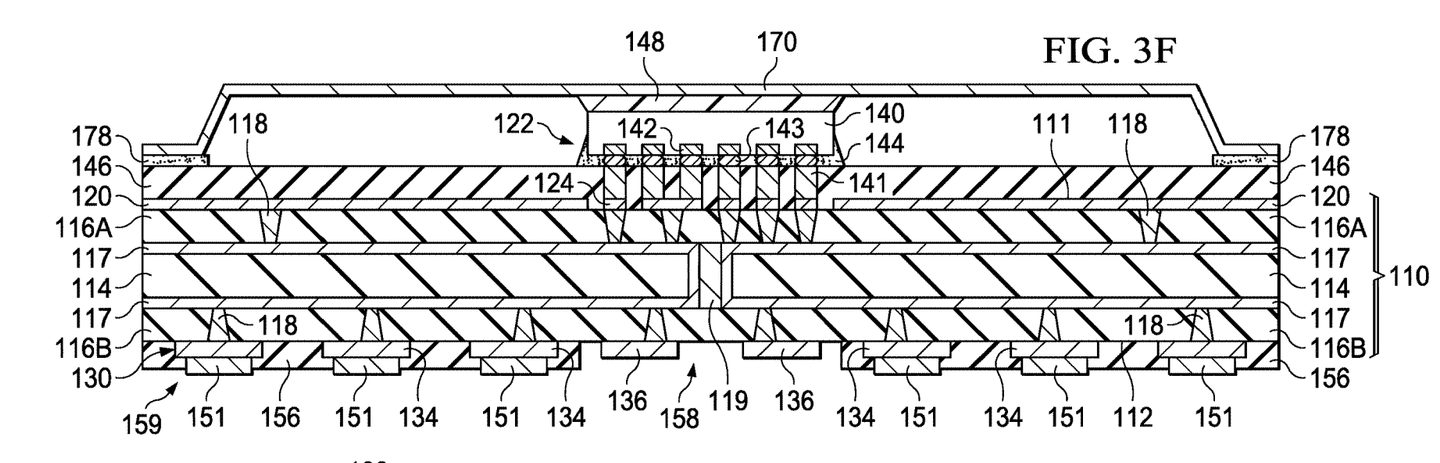
Figure 3G:
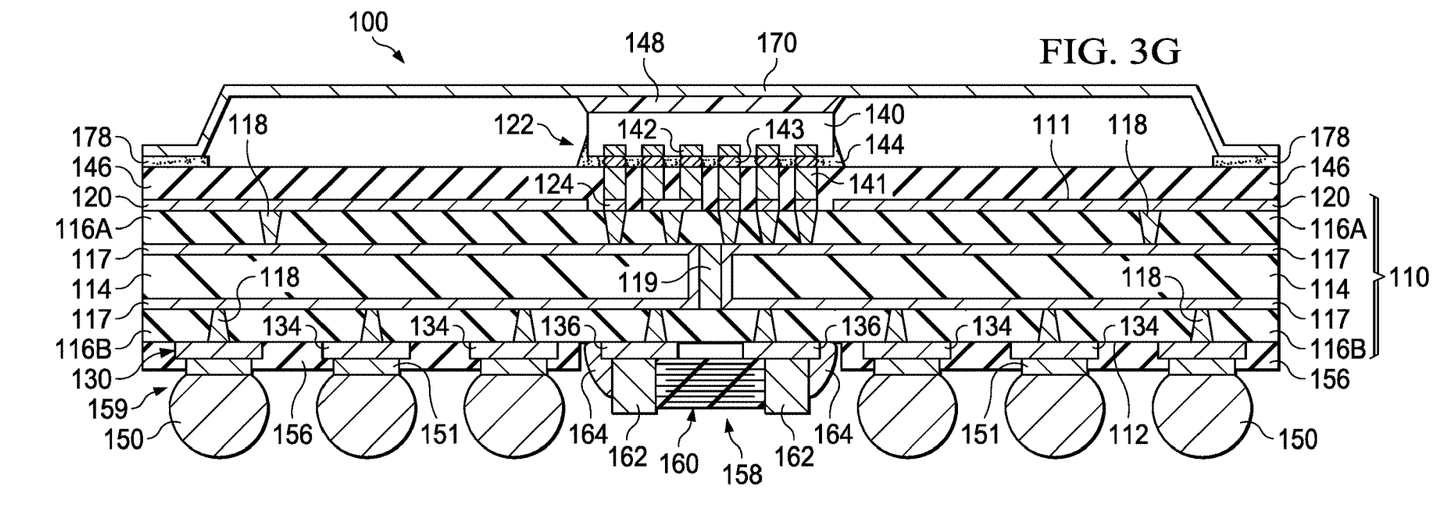

As shown in FIG. 3E, heat spreader 170 is thermally coupled to the passive side of semiconductor die 140 (FIG. 4, step 210). The passive side of semiconductor die 140 includes a thermal interface material 148 adjacent to heat spreader 170 to improve heat dissipation. In various examples, thermal interface material 148 may represent a thermal paste or thermal tape applied to semiconductor die 140 or heat spreader 170 prior to positioning heat spreader 170 over semiconductor die 140.

Adhesive 178 secures a flange 172 of heat spreader 170 to solder mask layer 146 outside a perimeter of semiconductor die 140 with adhesive 178, which may also represent a thermal interface material. In some examples heat spreader 170 may be electrically connected to external conductive layer 120, such as a grounded portion of external conductive layer 120. In such examples, adhesive 178 may represent a solder or an electrically conductive thermal interface material. Alternatives to semiconductor package 100 include molded semiconductor packages. In molded semiconductor packages, may be secured with package mold compound that covers a semiconductor die of the package or may be omitted depending on heat dissipation requirements for the molded semiconductor package.

Before or after arranging semiconductor die 140 on die attach site 122, and heat spreader 170 over semiconductor die 140, capacitor 160 is mounted to capacitor electrical contacts 136 within capacitor opening 158 (FIG. 4, step 212). Specifically, two capacitor terminals 162 of capacitor 160 are electrically connected to two capacitor electrical contacts 136 with a thickness of capacitor 160 is partially recessed within capacitor opening 158. Specifically, a recessed portion of capacitor 160 is capacitor opening 158 opening between capacitor electrical contacts 136 and a board-side surface of solder mask layer 156. For example, mounting capacitor 160 on two capacitor electrical contacts 136 may include includes applying a liquid solder between capacitor terminals 162 and two capacitor electrical contacts 136 to form direct solder connections 164 such that capacitor terminals 162 and two capacitor electrical contacts 136 are separated only by a capillary flow of direct solder connections 164. Because capacitor 160 is partially recessed within capacitor opening 158, the edges of capacitor opening 158 may help contain liquid solder within the capacitor opening 158, mitigating a risk of shorting with adjacent package electrical contacts 134. In examples in which capacitor electrical contacts 136 are non solder mask layer defined, direct solder connections 164 may form solder fillets over exposed edges of capacitor electrical contacts 136, which may improve adhesion between direct solder connections 164, capacitor electrical contacts 136 and capacitor terminals 162.

In conjunction with the attachment of capacitor 160 within capacitor opening 158, solder ball array 150 may be applied to pre-solder 151 within electrical contact openings 159 to form a solder ball array 150 (FIG. 4, step 214). For example, solder bumps may be positioned on pre-solder over package electrical contacts 134 at electrical contact openings 159 to facilitate a connection with an external device, through a solder reflow process for example.

In some examples, package 100 may be manufactured as part of a set of at least two packages formed in unison on a common substrate which includes a plurality of multilayer substrates 110. For example, multilayer substrate 110 may be formed as part of an array of multilayer substrates, and heat spreader 170 may be attached to multilayer substrate 110 as part of an array of heat spreaders manufactured from a common sheet attached to the array of multilayer substrates in unison.

Following the assembly of multilayer substrate 110, heat spreader 170, and semiconductor die 140 for an array of packages 100, the array of packages 100 may be singulated, for example, by cutting within interconnected portions of the array of multilayer substrates. Such cutting may also include cutting within interconnected portions of the array of heat spreaders 170 attached over the array of heat spreaders 170. Sawing may include cuts along a grid such that each package 100 has a rectangular profile.

Figure 5:
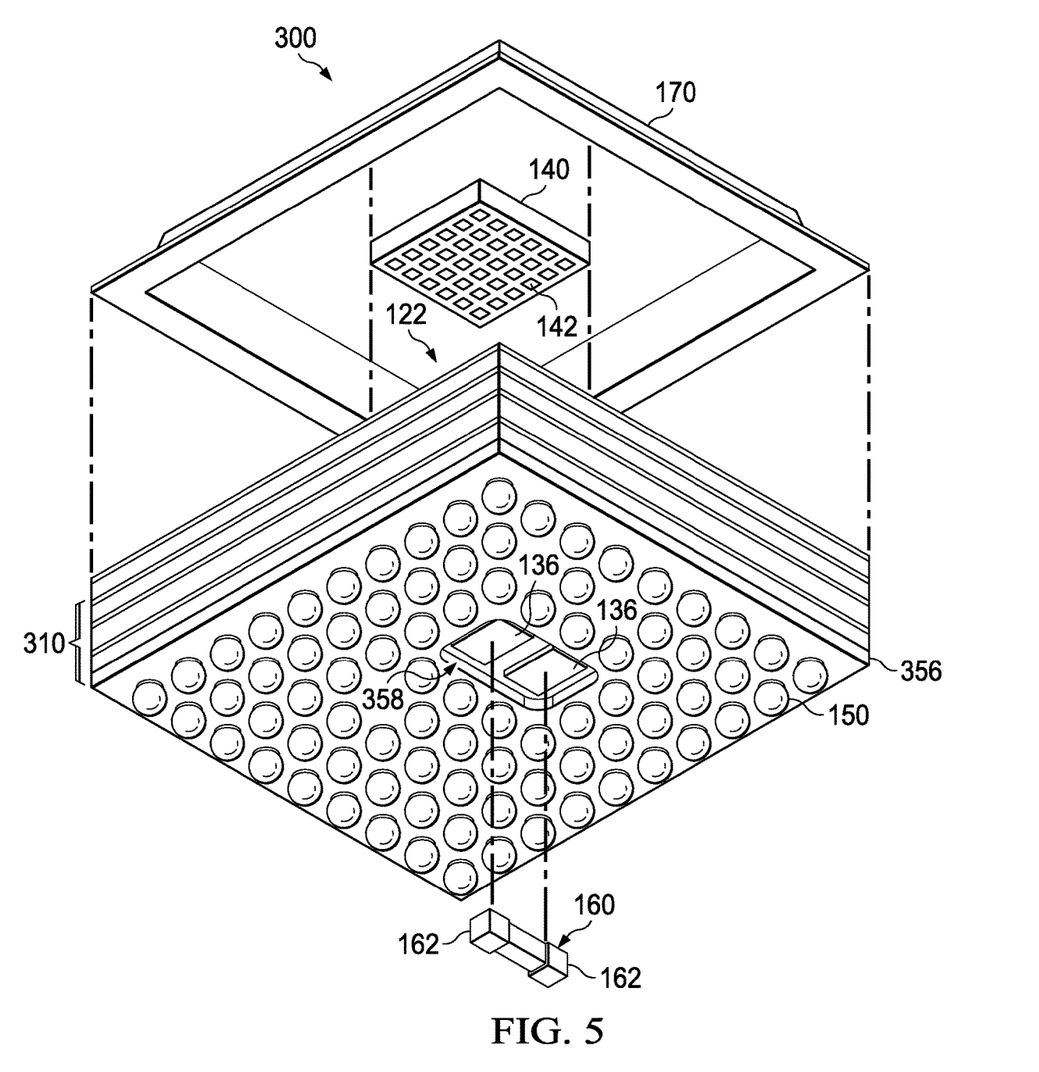
FIG. 5 illustrates a semiconductor package with a capacitor mounted within a capacitor opening of a solder mask layer of the package, the capacitor opening including rounded sides.

FIG. 5 is an exploded perspective view a semiconductor package 300. Semiconductor package 300 is similar to semiconductor package 100 except that multilayer substrate 110 has been replaced with multilayer substrate 310. Multilayer substrate 310 is substantially similar to multilayer substrate 110 except that capacitor opening 358 in solder mask layer 356 includes rounded sides rather than square corners. For brevity, many details of described with respect to semiconductor package 100 are not repeated with respect to semiconductor package 300.

The rounded sides of capacitor opening 358 may improve solder joint integrity between capacitor electrical contacts 136 of multilayer substrate 310 and capacitor 160 as compared to multilayer substrate 110. The rounded shape of capacitor opening 358 would impart a rounded shape to the solder flow contacting edges of capacitor opening 358. Such a rounded shape of the solder may have reduced stress concentrations, thereby mitigating delamination between solder mask layer 356 and the solder. In addition, the rounded shape may also reduce or eliminate the presence of a gap in the contact area between the solder and corners of capacitor opening 358, which can further mitigate delamination between solder mask layer 356 and the solder. The shape of capacitor opening 358 corresponds to the pattern of the photolithography process used to form capacitor opening 358 and electrical contact openings in solder mask layer 356. In this manner, choosing the shape of capacitor opening 358 merely involves changing the pattern of the photolithography process.

In particular examples, a radius of the rounded shape of capacitor opening 358 may be at least 50 percent of a thickness of solder mask layer 356 as the benefits described above may be more limited at a smaller radius. A maximum radius is only limited by the size of capacitor opening 358 and available space within solder ball array 150. In other examples, capacitor opening 358 may have a rounded oblong shape without straight sides, rather than a rectangular shape with rounded corners.

The specific techniques for semiconductor packages including a capacitor mounted within a capacitor opening of a solder mask layer, including techniques described with respect to semiconductor packages 100, 300 are merely illustrative of the general inventive concepts included in this disclosure as defined by the following claims.

What is claimed is:

1. A method of forming a semiconductor package comprising:
    mounting a semiconductor die on a multilayer substrate to electrically connect the semiconductor die to a first set of electrical contacts of the multilayer substrate,
    wherein the multilayer substrate comprises:
        a dielectric layer;
        a first conductive layer forming the first set of electrical contacts on a first side of the dielectric layer;
        a second conductive layer forming a second set of electrical contacts on a second side of the dielectric layer, the second set of electrical contacts including package electrical contacts and two capacitor electrical contacts;
        conductive vias extending through the dielectric layer between the first conductive layer with the second conductive layer; and
        a solder mask layer over the second conductive layer, the solder mask layer forming electrical contact openings adjacent the package electrical contacts and forming a capacitor opening over the two capacitor electrical contacts; and
    mounting a capacitor on the two capacitor electrical contacts to electrically connect the capacitor to the two capacitor electrical contacts with a recessed portion of the capacitor being within the capacitor opening between the two capacitor electrical contacts and a board-side surface of the solder mask layer, wherein mounting the capacitor on the two capacitor electrical contacts includes reflowing solder paste between capacitor terminals of the capacitor and the two capacitor electrical contacts to form direct solder connections with the capacitor terminals and the two capacitor electrical contacts separated only by a capillary flow of the direct solder connections.

2. The method of claim 1, further comprising:
applying the solder mask layer over the second conductive layer; and
patterning the solder mask layer to form the electrical contact openings adjacent each of the package electrical contacts and forming the capacitor opening over the two capacitor electrical contacts such that the electrical contact openings are solder mask layer defined, and the two capacitor electrical contacts are non solder mask layer defined.

3. The method of claim 2, further comprising applying pre-solder within the electrical contact openings, but not the capacitor opening.

4. The method of claim 1, wherein mounting the semiconductor die on the multilayer substrate includes processing a set of solder bumps to form electrical connections between the semiconductor die and the first set of electrical contacts.

5. The method of claim 1, further comprising applying a plurality of solder bumps to the electrical contact openings to form a solder ball array.

6. A method of forming a semiconductor package comprising:
mounting a semiconductor die on a multilayer substrate, wherein the multilayer substrate comprises:
a dielectric layer;
a first conductive layer forming a first set of electrical contacts on a first side of the dielectric layer;
a second conductive layer forming a second set of electrical contacts on a second side of the dielectric layer, the second set of electrical contacts including package electrical contacts and two capacitor electrical contacts;
conductive vias extending through the dielectric layer between the first conductive layer and the second conductive layer; and
a solder mask layer over the second conductive layer, the solder mask layer forming electrical contact openings adjacent the package electrical contacts and forming a capacitor opening over the two capacitor electrical contacts; and
mounting a capacitor on the two capacitor electrical contacts that includes reflowing solder paste between capacitor terminals of the capacitor and the two capacitor electrical contacts to form direct solder connections with the capacitor terminals.

7. The method of claim 6, wherein mounting the capacitor includes electrically connecting the capacitor to the two capacitor electrical contacts with a recessed portion of the capacitor being within the capacitor opening between the two capacitor electrical contacts and a board-side surface of the solder mask layer.

8. The method of claim 6, wherein the capacitor opening has a rounded shape with a radius at least 50 percent of a thickness of the solder mask layer.

9. The method of claim 6, wherein mounting the semiconductor die on the multilayer substrate is to electrically connect the semiconductor die to the first set of electrical contacts of the multilayer substrate.

10. A method of forming a semiconductor package comprising:
mounting a semiconductor die on a multilayer substrate, wherein the multilayer substrate comprises:
a dielectric layer;
a first conductive layer forming a first set of electrical contacts on a first side of the dielectric layer;
a second conductive layer forming a second set of electrical contacts on a second side of the dielectric layer, the second set of electrical contacts including package electrical contacts and two capacitor electrical contacts;
conductive vias extending through the dielectric layer between the first conductive layer with the second conductive layer; and
a solder mask layer over the second conductive layer, the solder mask layer forming electrical contact openings adjacent the package electrical contacts and forming a capacitor opening over the two capacitor electrical contacts; and
mounting a capacitor on the two capacitor electrical contacts, wherein direct solder connections electrically connect the two capacitor electrical contacts with the capacitor terminals.

11. The method of claim 10, wherein mounting the capacitor includes electrically connecting the capacitor to the two capacitor electrical contacts with a recessed portion of the capacitor being within the capacitor opening between the two capacitor electrical contacts and a board-side surface of the solder mask layer.

12. The method of claim 10, wherein the capacitor opening has a rounded shape with a radius at least 50 percent of a thickness of the solder mask layer.

13. The method of claim 10, wherein mounting the semiconductor die on the multilayer substrate is to electrically connect the semiconductor die to the first set of electrical contacts of the multilayer substrate.

14. The method of claim 10 further comprising applying a plurality of solder bumps to the electrical contact openings to form a solder ball array.

\* \* \* \* \*